United States Patent
Zargari et al.

(10) Patent No.: US 7,965,526 B2
(45) Date of Patent: Jun. 21, 2011

(54) SELF POWERED SUPPLY FOR POWER CONVERTER SWITCH DRIVER

(75) Inventors: Navid R. Zargari, Cambridge (CA); Zhongyuan Cheng, Cambridge (CA); Angelo R. Bortolus, Mississauga (CA)

(73) Assignee: Rockwell Automation Technologies, Inc., Mayfield Heights, OH (US)

( * ) Notice: Subject to any disclaimer, the term of this patent is extended or adjusted under 35 U.S.C. 154(b) by 114 days.

(21) Appl. No.: 12/423,891

(22) Filed: Apr. 15, 2009

(65) Prior Publication Data
US 2010/0265740 A1 Oct. 21, 2010

(51) Int. Cl.
*H02H 7/10* (2006.01)
(52) U.S. Cl. .................. 363/50; 363/56.12
(58) Field of Classification Search .......... 363/50, 363/52, 53, 54, 55, 56.12, 132
See application file for complete search history.

(56) References Cited

U.S. PATENT DOCUMENTS

| | | | |
|---|---|---|---|
| 4,542,440 A | 9/1985 | Chetty et al. | |
| 5,424,937 A | 6/1995 | Iyotani et al. | |
| 5,483,192 A | 1/1996 | Tai | |
| 5,796,599 A | 8/1998 | Raonic et al. | |
| 5,982,646 A | 11/1999 | Lyons et al. | |
| 6,351,359 B1 | 2/2002 | Ulrik | |
| 6,351,397 B1 | 2/2002 | Sawa et al. | |
| 6,366,483 B1 | 4/2002 | Ma et al. | |
| 6,396,672 B1 | 5/2002 | Deam | |
| 6,417,719 B1 | 7/2002 | Deam | |
| 6,493,242 B1 | 12/2002 | Riggio et al. | |
| 6,710,994 B1 | 3/2004 | Deam | |
| 6,970,367 B2 * | 11/2005 | Takeshima et al. | 363/147 |
| 7,511,976 B2 | 3/2009 | Zargari et al. | |
| 2003/0103360 A1 | 6/2003 | Hatta et al. | |
| 2004/0264218 A1* | 12/2004 | Ohishi et al. | 363/21.04 |
| 2005/0259451 A1* | 11/2005 | Mbaye | 363/40 |
| 2007/0297202 A1* | 12/2007 | Zargari et al. | 363/50 |
| 2008/0231211 A1* | 9/2008 | Baarman et al. | 315/294 |

FOREIGN PATENT DOCUMENTS

| | | |
|---|---|---|
| EP | 0 573 836 A3 | 5/1993 |
| EP | 0 573 836 A2 | 12/1993 |
| FR | 1 582 031 A | 9/1969 |
| JP | 56 68432 A | 12/1981 |
| JP | 59086475 A | 5/1984 |

OTHER PUBLICATIONS

Dusan M. Raonic, "SCR Self-Supplied Gate Driver for Medium-Voltage Application with Capacitor as Storage Element", IEEE Industry Applications, vol. 36, No. 1, Jan./Feb. 2000.

(Continued)

*Primary Examiner* — Adolf Berhane
*Assistant Examiner* — Nguyen Tran
(74) *Attorney, Agent, or Firm* — Fay Sharpe, LLP; Alexander R. Kuszewski; John M. Miller (57) ABSTRACT

Self-powered supplies with on-board diagnostics are presented for powering a power converter switch driver with power obtained from an associated snubber circuit, including a first converter stage with a full bridge rectifier with a crowbar circuit creating a first DC bus and a second stage with an isolated DC to DC converter, and on-board diagnostics to indicate snubber failures and abnormal conditions of the self-powered supply.

17 Claims, 6 Drawing Sheets

OTHER PUBLICATIONS

Dusan M. Roaonic, "SCR Self Supplied Gate Driver for Medium Voltage Application with Capacitor as Storage Element", IEEE Industry Applications Conference, Thirty-Third IAS Annual Meeting, Oct. 1998.

Dusan Raonic, Dave MacLennan, Didier Rouaud, "Some Experience with SCR's Self Powered Gate Driver Storage System for Medium Voltage Solid State Starter", IEEE Canadian Conference on Electrical and Computer Engineering Conference (CCECE), Sr. John's, Newfoundland, Canada, May 25-28, 1997.

Power Integrations, "TOP242-250 TOPswitch-GX Family Application Notes", Nov. 2005.

B. Obegard, R. Ernst, "Applying IGCT Gate Units", ABB Application Note 5SYA 2031, Dec. 2002.

European Search Report, Application No. EP 10 16 0044, Oct. 22, 2010.

* cited by examiner

SELF POWERED SUPPLY FOR POWER CONVERTER SWITCH DRIVER

FIELD OF THE DISCLOSURE

The present disclosure relates generally to electrical power conversion and more particularly to self-powered switch driver systems for power converters.

BACKGROUND

Power conversion systems are employed to convert electrical power from one form and/or level, whether AC or DC, to another (AC or DC) in various applications such as pulse width modulated (PWM) current source rectifiers used in high-power motor drives with AC input power being selectively switched to create a DC output bus voltage from which a load is driven. Power converters may include multiple stages for different types of conversion applications, such as AC/DC/AC drives for electric motors, in which input AC power of a given frequency and voltage is first converted to a DC bus, with a second stage selectively switching the DC bus power to create single or multi-phase AC output power of variable voltage and/or frequency. This type of converter is particularly useful in driving electric motors in industrial applications requiring variable speed control with varying motor load situations. In the controlled switching of the input and output power in one or more converter stages, high voltages and currents are experienced by the power switches, where semiconductor-based switches are typically used to switch the power at relatively high frequencies. The control terminals or gates of the switching devices require gate driver circuits to generate the switch signals for actuating the power switch for controlled operation in power conversion applications. In high voltage power conversion applications, the gate driver circuit needs to be operated with power that is isolated from the system ground since the input and output voltages may be several thousand volts or more. Conventional power converters often employ separate isolated DC power sources for powering the gate driver circuits. However, these driver power sources and isolation transformers occupy valuable space and add significant cost in power conversion systems, particularly for medium or high voltage systems operated with GCT or IGCT type switches. Thus, there remains a need for improved power conversion systems and gate driver power sources by which isolated gate driver power can be provided in a cost efficient manner without adding large external power sources.

SUMMARY OF DISCLOSURE

Various details of the present disclosure are hereinafter summarized to facilitate a basic understanding, where this summary is not an extensive overview of the disclosure, and is intended neither to identify certain elements of the disclosure, nor to delineate the scope thereof. Rather, the primary purpose of this summary is to present some concepts of the disclosure in a simplified form prior to the more detailed description that is presented hereinafter. The goal of reducing the cost and size of power conversion systems is addressed through the provision of an improved self-powered supply (SPS) that obtains energy from the snubber circuit associated with a power switching device and generates an isolated dc voltage for the gate driver. The SPS and the snubber form a series circuit between the switch device terminals such that the snubber circuit will transfer charging currents to a storage device in the SPS from which the switch driver power is derived.

In accordance with one or more aspects of the disclosure, power conversion systems and switch circuits thereof are provided for controlled conversion of electrical power, in which the switch circuits include a switching device, a switch driver, a snubber circuit, and a supply circuit that forms a series circuit with the snubber circuit in parallel with the switching device. The supply circuit is comprised of a first converter circuit with a rectifier coupled to the snubber, a supply storage device coupled with a first DC bus created by the rectifier, as well as a second converter circuit with an isolated DC to DC converter that provides an isolated main DC output to power the switch driver. In certain embodiments, the rectifier in the first converter circuit is a full bridge rectifier. In some embodiments, the first converter circuit includes a first converter switching device coupled with the rectifier and a diode coupled between the converter switching device and the supply storage device, as well as a first converter control circuit that controls the switching device to regulate the first DC bus. In certain embodiments, the isolated DC to DC converter provides an auxiliary DC output that powers the first converter control circuit.

In accordance with further aspects of the disclosure, the switch circuit includes a diagnostic circuit operatively coupled with one or both of the converter circuits that monitors at least one condition of the switch circuit, such as the status of the first DC bus, the main DC bus, a snubber current, etc. The auxiliary DC output in certain embodiments powers the diagnostic circuit. The first converter circuit may include a shunt coupled with the rectifier to sense a snubber current and the diagnostic circuit is operatively coupled with the shunt to monitor the snubber current. The diagnostic circuit may include an optical output providing a coded visual indication of detected one fault condition(s) and may also include a diagnostic control output that provides a signal indicative of at least one fault condition detected by the diagnostic circuit, such as for use by the converter control system to facilitate quick shutdown where a snubber failure is suspected.

BRIEF DESCRIPTION OF THE DRAWINGS

The following description and drawings set forth certain illustrative implementations of the disclosure in detail, which are indicative of several exemplary ways in which the various principles of the disclosure may be carried out. The illustrated examples, however, are not exhaustive of the many possible embodiments of the disclosure. Other objects, advantages and novel features of the disclosure will be set forth in the following detailed description of the disclosure when considered in conjunction with the drawings, in which.

DETAILED DESCRIPTION OF THE DISCLOSURE

Figure 1:
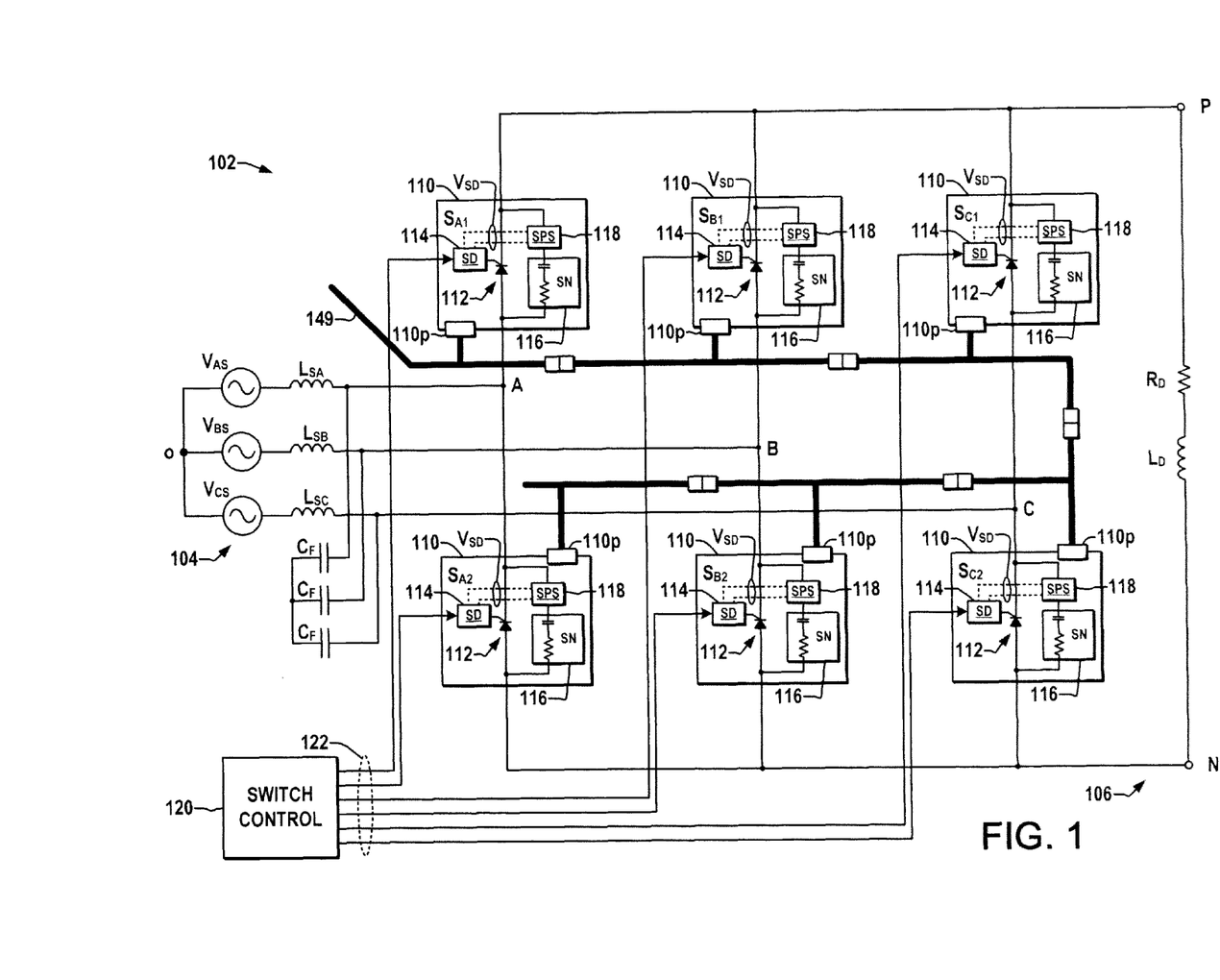
FIG. 1 is a schematic diagram illustrating an exemplary power conversion system comprising switch circuits according to the disclosure.

Referring to the figures, several embodiments or implementations are hereinafter described in conjunction with the drawings, wherein like reference numerals are used to refer to like elements throughout, and wherein the various features are not necessarily drawn to scale. FIG. 1 illustrates an exemplary power conversion system or power converter 102 having a plurality of self-supplied switch circuits 110 for controlled conversion of input electrical power to output electrical power. The illustrated power converter 102 is a pulse width modulated (PWM) current source rectifier (CSR) finding utility in high-power drives for electric motors, and the various features of the present disclosure are illustrated and described hereinafter in this context. However, the disclosure may be advantageously employed in any type of single or multi-stage switched power conversion system, wherein the disclosure is not limited to the specifically illustrated examples. The system 102 receives three phase AC input electrical power from a three phase source 104 at phase terminals A-C through optional source inductors $L_{SA}$, $L_{SB}$, and $L_{SC}$ where the voltages and currents provided by the source 104 may be of any values. The converter 102 may also include optional input filter capacitors $C_F$. The converter 102 includes six symmetrical switch circuits 110 individually labeled as $S_{A1}$, $S_{B1}$, $S_{C1}$, and $S_{A2}$, $S_{B2}$, and $S_{C2}$ in FIG. 1 which are operative to selectively couple the AC input phase lines A, B, and C with one of two DC bus output lines P and N according to switch control signals 122 provided by a switch control system 120. The controlled provision of the signals 122 causes the switch circuits 110 to create a DC output voltage at the terminals P and N of an output 106 for driving a load, illustrated in FIG. 1 as a resistor $R_D$ in series with an inductor $L_D$. The individual switch circuits 110 include a switching device 112, a switch driver 114, a snubber circuit 116, and a supply circuit (e.g., self-powered supply or SPS) 118, arranged with the snubber 116 and the supply circuit 118 forming a series path across the switch 112.

The switch circuit 110 provides terminals for connection to first and second circuit nodes, such as the lines A, B, C of the input 104 or the lines P, N of the converter output 106 (FIG. 1), with the switching device 112 connected between the circuit nodes to selectively couple or decouple the nodes. Depending on system voltage, device voltage rating and power loss requirements, multiple switch circuits 110 can be used in series for each of the six positions of 110 shown in FIG. 1 in order to share the voltage and reduce power loss per switch circuit. The switch circuit 110 also has a control terminal to receive the switch control signal 122 from the switching control system 120. The switch 112 can be any form of electrical power switch operable according to a switching signal to selectively allow or inhibit conduction of electrical current, such as SCRs GCTs, IGCTs, GTOs, SGCTs (Symmetric Gate Commutated Thyristors), etc. The switch 112 comprises first and second switch terminals coupled with the circuit nodes, and a gate or control terminal coupled to the output of the switch driver 114. The control terminal receives the switching signal from the driver 114 for controlled operation to place the switch 112 in either a conductive state or a nonconductive state so as to control the conduction of current between the circuit nodes. The switch driver 114 has an output terminal coupled with the switch control terminal at which the switching signal is provided according to a received switching control signal 122, and the driver 114 also includes at least one power terminal at which power is received from the supply circuit 118, indicated in FIG. 1 as a switch driver voltage $V_{SD}$. Unlike conventional power converters, therefore, the system 102 requires no separate supply bus or system to power the gate drivers 114 of the switch circuits 110, as these are self-powered by operation of the SPS 118 as described further below. Further description of self-powered supplies is found in U.S. Pat. No. 7,511,976 to Zargari et al., issued Mar. 31, 2009 and assigned to the assignee of the present disclosure, the entirety of which is hereby incorporated herein by reference.

In operation, the switching control system 120 provides switch control signals 122 according to a pulse width modulation scheme taking into account a desired or setpoint output voltage or current and the current output condition, where the switching control system 120 preferably receives one or more feedback signals (not shown) and derives an appropriate switching pulse width or other switching pattern and where the switching control signal is generally a pulse waveform provided at one of two distinct levels at any given time, with the pulse widths and timing provided so as to direct the converter output 106 to the desired or setpoint state. The switch driver 114 receives the control signal 122 and provides the switching signal accordingly so as to control operation of the switching device 112 using the voltage $V_{SD}$ provided at the power terminal(s). The switch driver 114 and the switching device 112 in certain embodiments are integrated. For example, the switching device 112 may be a gate commutated thyristor (GCT) with a gate control terminal receiving the switching signal from the switch driver 114, where the switch driver 114 and the switch 112 form an integrated gate commutated thyristor (IGCT).

Figure 2:
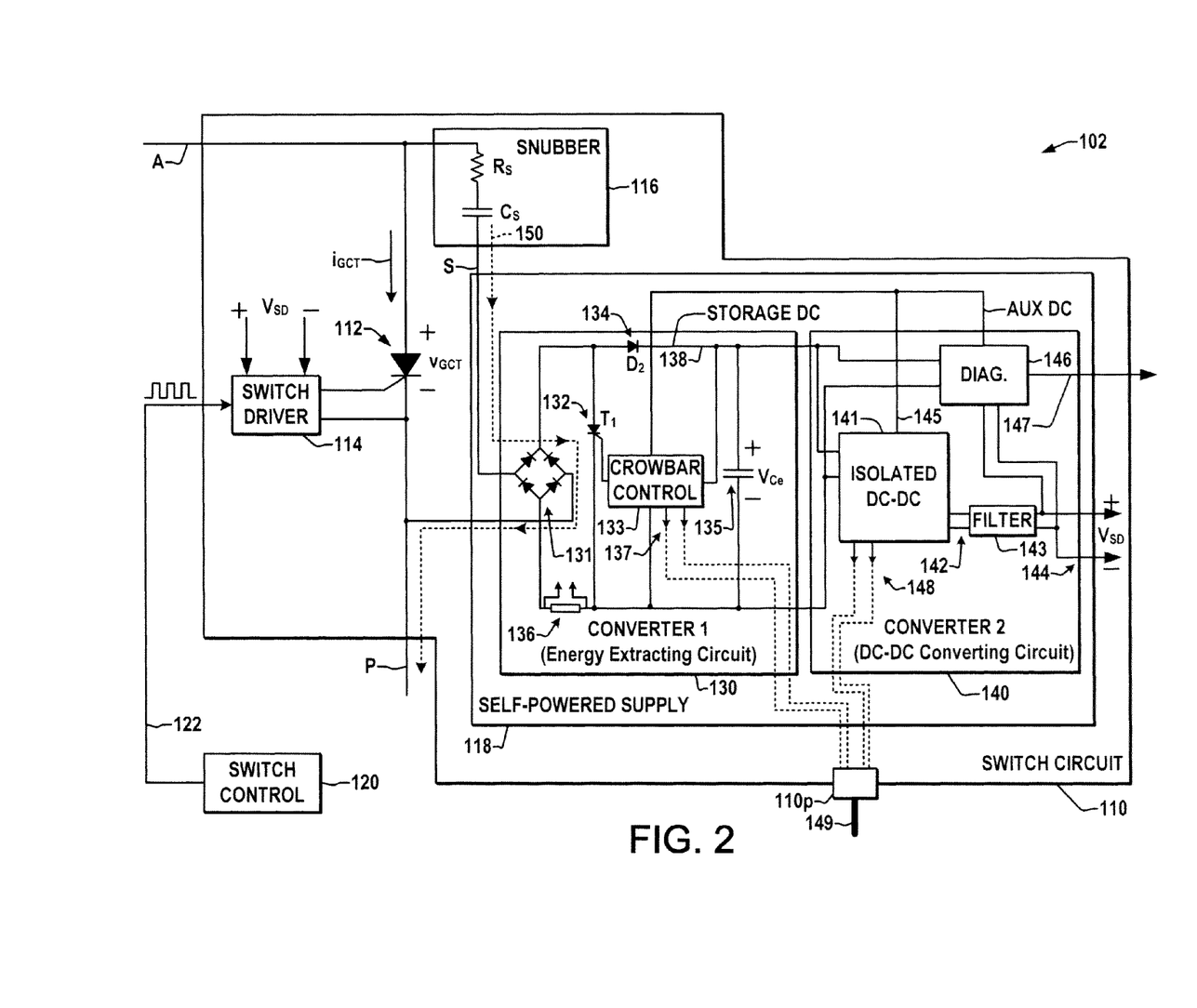
FIG. 2 is a schematic diagram illustrating further details of an exemplary switch circuit in the system of FIG. 1, with a dual stage supply circuit providing power for the switch driver circuit using power derived from the snubber.

Referring also to FIG. 2, the snubber circuit 116 comprises at least one snubber storage device such as a capacitor $C_S$ or multiple capacitors, etc. and includes first and second snubber terminals. One snubber terminal is coupled to the anode node of the switch 112 and the other is coupled with the circuit node whereby the SPS 118 and the snubber 116 form a series circuit connected in parallel with the switch terminals between the circuit nodes. In this configuration, the snubber 116 absorbs switching energy so as to protect the switch 112 and provides at least a portion of this snubber energy to the supply circuit 118 for powering the driver 114 and for implementing the diagnostic functions as described herein.

Figure 3:
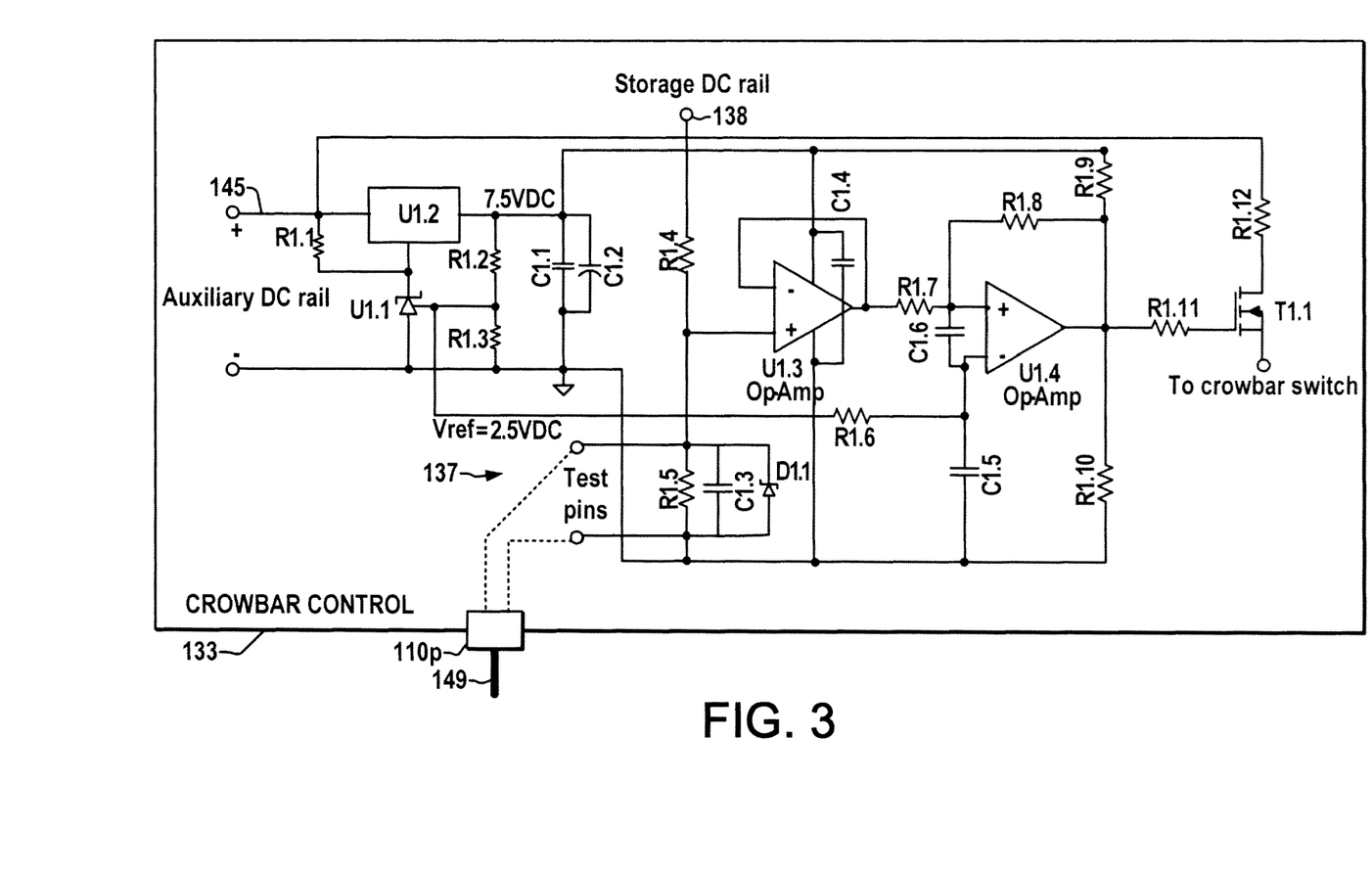
FIG. 3 is a schematic diagram illustrating further details of a crowbar switch control circuit in the first stage of the supply circuit of FIGS. 1 and 2.

The exemplary supply circuit 118 includes a first converter circuit 130 (CONVERTER 1 in FIG. 2) that extracts energy from the snubber circuit 116 and stores the extracted energy in a storage capacitor 135, along with a second converter circuit 140 (CONVERTER 2 in FIG. 2) that converts the storage DC voltage on the capacitor 135 into a main DC output 144 to power the switch driver 114. The exemplary first converter circuit 130 includes a full bridge rectifier 131 coupled to the snubber circuit 116 creates the first DC bus 138 across the supply storage device 135. The first converter circuit 130, moreover, includes a first converter switching device 132 (e.g., an SCR, IGBT, MOSFET, or other active semiconductor switch) forming a crowbar circuit across the output of the rectifier 131 and operative according to a signal from a converter (crowbar) control circuit 133 to regulate the first DC bus by selectively bypassing the rectified snubber current, as well as a diode 134 coupled between the crowbar switch 132 and the storage capacitance 135. In this manner, the first converter circuit 130 rectifies and regulates the first DC bus 138 (storage DC) using energy extracted from the snubber 116 and provides the bus as an input to the second converter circuit 140. The first converter circuit 130 operates to extract energy from the snubber 116 regardless of the polarity of the snubber current where the storage capacitance 135 receives charging current from the snubber circuit 116 when the voltage across the terminals of the switch 112 is positive and also when the switch voltage is negative. Further details of the exemplary crowbar control circuit 133 are illustrated in FIG. 3 as described further below. The exemplary first converter circuit 130 also includes a shunt 136 coupled with the rectifier 131 to sense the snubber current and to provide a sensed snubber current signal to the diagnostic circuit 146 in the second converter circuit 140, as well as a test output 137 (e.g., pin(s) on a test connector or interface) for testing the function of the circuit 118.

The second converter circuit 140 includes an isolated DC to DC converter 141 receiving the first DC bus 138 and providing the isolated main DC output 144 (VSD) to power the switch driver 114. The exemplary isolation DC to DC converter 141 is further described below in connection with FIG. 6. In the illustrated embodiment, the second converter 140 generates a DC output 142 that is provided to a filter 143, and the output of the filter 143 is provided as the main DC output 144, where the main DC output is provided to the diagnostic circuit 146 for monitoring. The DC to DC converter 141 also provides an auxiliary DC output 145 used to power the crowbar control circuit 133 and the diagnostic circuit 146. The diagnostic circuit 146 provides one or more output signals, values, or indications 147 to notify the switch control system 120 and/or a user of diagnostic conditions of the switch circuit 110, and is described in greater detail below in connection with FIG. 5. The second converter circuit 140 has low and high voltage protection as well as short circuit protection, and creates multiple DC outputs via the converter 141, including the main DC output 144 for the switch driver 114, the auxiliary DC output 145 for the crowbar control and diagnostic circuits 133 and 146, respectively. In addition, the exemplary converter circuit 140 provides adjustable startup voltage and automatically brings the converter 102 into a test mode when a test cable 149 is connected to test output 148.

In operation of the switch circuit 110 of FIG. 2, the circuit 110 is coupled between converter circuit nodes A (AC input line A in FIG. 1) and P (DC output terminal P in system 102), with the SPS supply circuit 118 converting energy transferred from the snubber circuit 116 into a regulated switch driver dc voltage $V_{SD}$ of about 20V in one example for driving a GCT type gate driver 114 to operate a GCT device 112 in a medium voltage converter 102 with operating voltages on the order of 1-35 kV, where the DC to DC converter 141 provides electrical insulation on the order of hundreds of volts between the snubber circuit 116 and the GCT gate driver 114. In this manner, the snubber energy is converted and used by the switch driver 114 to generate a positive gate voltage to turn the GCT switch 112 on (conductive state) or a negative gate voltage to turn the switch 112 off (nonconductive state). Switch circuit 110 can also be used in series between circuit nodes A and P in order to increase voltage capability and reduce switching power losses.

Figure 4:
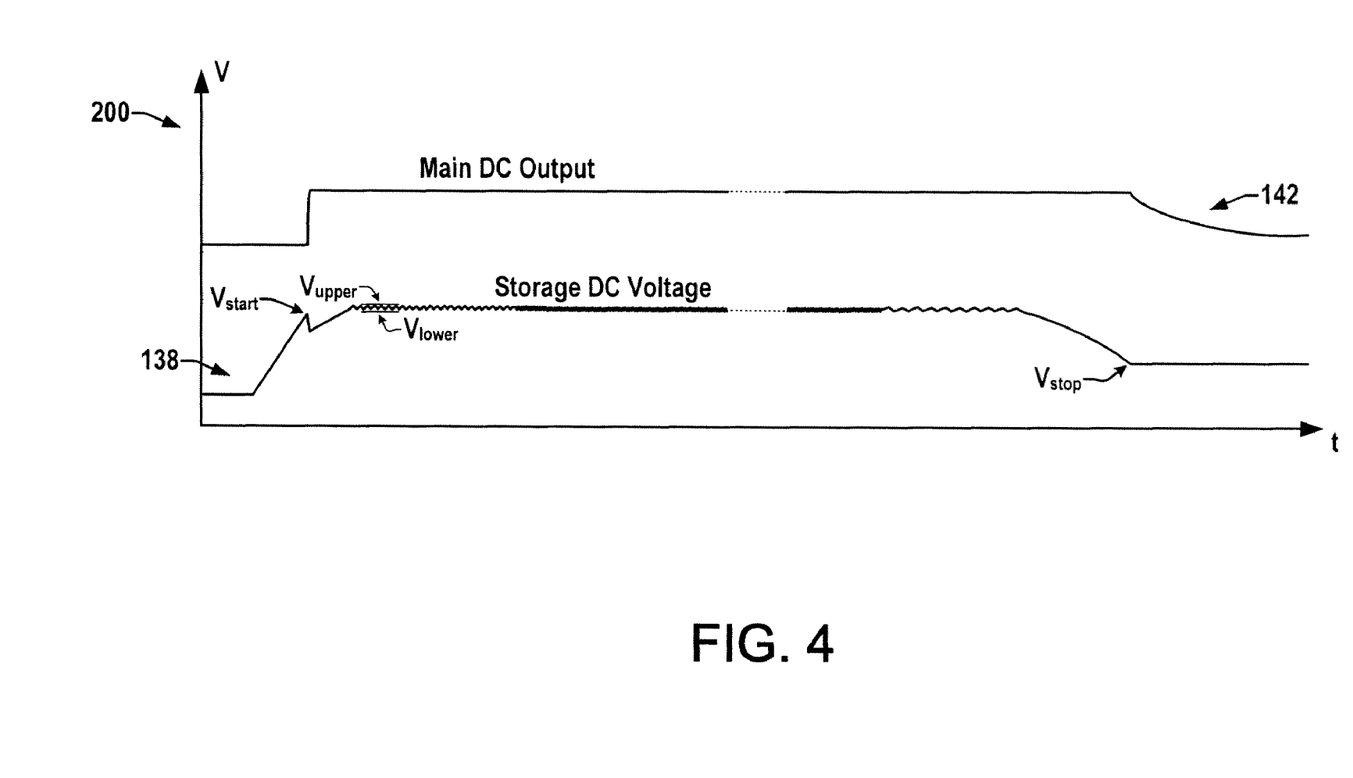
FIG. 4 is a graph illustrating exemplary storage DC and main DC voltage waveforms in the dual stage supply circuit of FIGS. 1 and 2.

Referring now to FIGS. 3 and 4, FIG. 3 shows further details of the exemplary crowbar switch control circuit 133 which is operated using power from the auxiliary DC 145. The circuit 133 provides test output 137 (e.g., pin(s) on a test connector or interface) for testing the circuit 118 in combination with test output 148 of the isolated DC-DC converter 141. In operation, the control circuit 133 determines whether the storage DC 138 is higher than a preset value, and if so, turns on the crowbar switch 132. In addition, the exemplary control circuit 133 employs hysteretic or similar control techniques to limit the switching frequency of the crowbar switch 132 and to control DC ripple on the storage DC rail 138. A shunt regulator or zener U1.1 and a series regulator U1.2 regulate the voltage of the auxiliary DC voltage 145 to create a 7.5V DC power supply and a 2.5VDC reference voltage in one example. The voltage of the storage DC rail 138 is buffered by an op-amp U1.3 and provided to a non-inverting input of an op-amp U1.4. U1.4, in turn, compares the input with the 2.5V reference voltage and generates a gating signal for transistor/MOSFET/IGBT T1.1, which is used to control the gate of the crowbar switch 132, such that when T1.1 is turned on, the crowbar switch 132 bypasses the snubber current, where the transistor T1.1 is connected to the auxiliary DC rail 145 to prevent disturbance to the 7.5VDC caused by gate current of the crowbar switch 132. The values of resistors R1.4, R1.5, R1.7 and R1.8, combined with the voltage values 7.5V and 2.5V in the illustrated embodiment are chosen to control the hysteresis band, thus control the DC ripple on storage capacitor 135 and the switch frequency of crowbar switch 132. Referring also to graph 200 in FIG. 4, the voltage of the storage DC bus 138 and its ripple current can be controlled to acceptable levels between an upper limit (Vupper) and a lower limit (Vlower) via the circuit 133. In addition, the control circuit Con 2.1 shown in FIG. 6 controls another hysteresis band between a start voltage Vstart at which the unfiltered main DC output 142 is active (high) and a stop voltage Vstop at which the main output 142 is no longer maintained. Connection of a test cable 149 to the test pins 137 across resistor R1.5, moreover, allows the crowbar switch 132 gating to be disabled.

Figure 5:
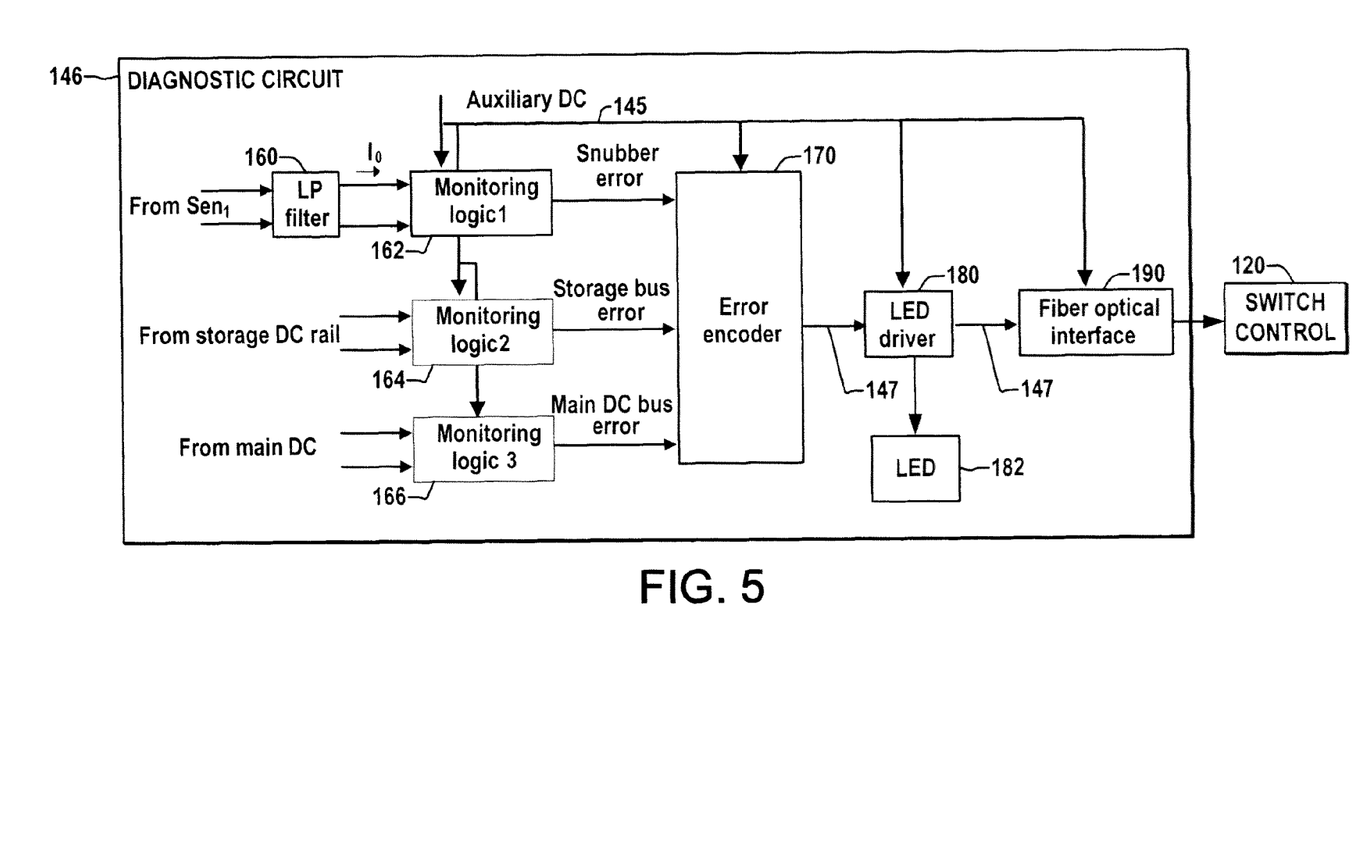
FIG. 5 is a schematic diagram illustrating further details of an exemplary diagnostic circuit in the dual stage supply circuit of FIGS. 1 and 2.

FIG. 5 further illustrates the exemplary diagnostic circuit 146 in the second converter circuit 140. The diagnostic circuit 146 monitors one or all of snubber current (via the signal from the shunt 136 in FIG. 2), the storage DC rail voltage 138, and the filtered main DC bus voltage 144. As shown in FIG. 5, the sensed snubber current signal from the shunt 136 is provided as a sense input Sen$_1$ to monitoring logic circuit 162 via a low pass filter 160. The rms snubber current after the filter 160 is given by the following equation (1):

$$I_0 = \frac{k_1 k_2}{n} V_{l-l} \omega C_{sn}, \quad (1)$$

where $k_1$ is the voltage gain of converter seen by the snubber circuit (e.g., less than 0.7 for three-phase current source converters 102) $k_2$ is the gain of the current sensor Sen1, $V_{l-l}$ is the line to line voltage of the input 104 (FIG. 1). n is number of GCTs in series, $\omega$ is the input power frequency, and $C_{sn}$ is the snubber capacitance. In this regard, the snubber circuit 116 most often fails due to an increase of capacitance prior to catastrophic failure, leading to an increase in the rms snubber current. The logic 162 compares the sensed rms snubber current to an upper limit and generates an error signal to encoder logic 170 when the upper limit is exceeded to alert the higher level controller and/or a user. In one implementation, the snubber error generates an encoded error signal provided by the encoder 170 to an LED driver 180 that lights an LED 182 to generate an optical pattern indicating a snubber error, and the circuit 170 also provides a signal or value 147 to an interface 190 (e.g., fiber optic or other wired or wireless interface) that may be used to signal the switch control system 120 of the converter 102 for diagnostic shutdown of the system 102 to prevent damage to the switch 112 or other system components.

The diagnostic circuit 146 also monitors the storage DC voltage 138 by monitoring logic 164 which can provide comparison with an upper boundary and lower boundary to set a normal range of operation. A lower boundary provides notice to the switch control system 120 that the supply circuit 118 is expected to run out of power soon, and appropriate controlled shutdown or other proactive control may be implemented to mitigate or avoid sudden converter failure including preventing GCT failure. The lower boundary for DC rail error in one implementation can be set between $V_{stop}$ and $V_{lower}$ in FIG. 4 above. The upper limit can be set to a value safe to the components connected to the storage rail 138, such as capacitors in the switch circuit 110. The main DC output 142 is monitored by monitoring logic 166, where upper and lower boundaries can be set in a range according to the power supply tolerance of the switch driver 114. The error signals are encoded and sent as signals and/or values 147 to the driver 180 and/or the interface 190. In one embodiment, fiber-optic and/or electrical interface links are used to send the signals/values to a GCT gate board to relay the error to the controller 120 or the error signal/value may be sent directly to the controller 120 via the fiber-optic link 190. In one possible embodiment, the optical signaling provides different pulse patterns to indicate one or more conditions, including without limitation a storage DC overvoltage, storage DC undervoltage, a main DC output high, main DC output low, and snubber circuit abnormal.

Figure 6:
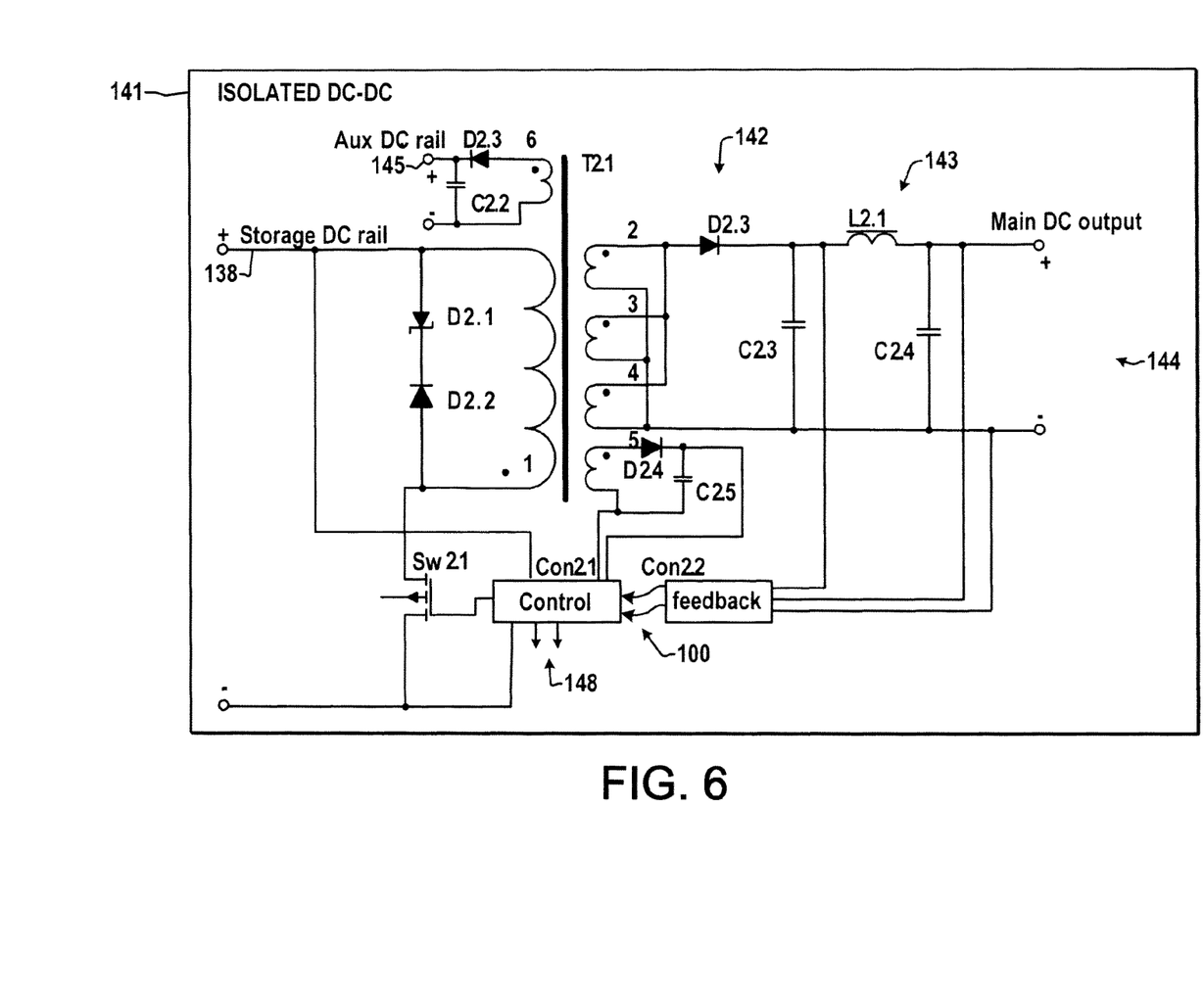
FIG. 6 is a schematic diagram illustrating an exemplary isolated DC to DC converter in the second stage of the supply circuit of FIGS. 1 and 2.

FIG. 6 illustrates further details of an exemplary isolated DC to DC converter 141 in the second converter circuit 140, which converts the DC power from the storage bus 138 to a regulated main DC output 144 for powering the switch driver 114. The exemplary circuit 141 is a flyback converter with a multiple-winding transformer T2.1, where a first winding 1 is connected to the storage DC bus 138 and is controlled by a semiconductor switch Sw2.1. The gate of the switch Sw2.1 is driven by a control circuit Con2.1, which controls the duty cycle of Sw2.1 based on feedback Con2.2 from the main DC output 144. Hysteresis control is applied to Con2.2 so that it starts the main output 144 at a voltage $V_{start}$ and stops at a lower voltage $V_{stop}$ (FIG. 4). Other functions such as over/under-voltage protection, thermal protection and switching frequency control can also be implemented in Con2.1. The switch Sw2.1 and Con2.1 can also be replaced by power switches with built-in control circuitry. The main DC output circuit includes windings 2-4 in FIG. 6, as well as diode D2.3, inductor L2.1 and capacitance C2.4. Windings 2-4 can also be a single winding or any other number of windings in parallel depending on power requirements. Winding 5 provides power to the feedback circuit Con2.2, and winding 6 provides power to the auxiliary DC rail 145. Alternate embodiments are possible in which the converter 141 can be other forms of step-down DC/DC converters with an isolation transformer. The feedback provided from Con2.2 to the control Con2.1 is obtained through an isolated opto-coupler link 100. This isolated link 100 provides an electrical isolation of hundreds of voltages between the snubber network 116 and the switch driver 114.

The switch circuit 110 may include a test port 110*p*, such as one or more electrical connectors or circuit pins providing access for testing by simple connection of a test cable 149 between the test port 110*p* and an AC power supply, wherein a single test cable 149 may be fashioned to connect to all the switch circuits 110 of a given converter 102 for concurrent testing of all switch circuits 110. In one embodiment, when the test cable 149 is connected to the test port 110*p*, no dangerous voltages are applied on the switching devices and heatsinks and the circuit 110 enters a test mode automatically. In the test mode, the circuit 110 is operable for a wide range of voltages, for example, from 85V to 265V at 50 or 60 Hz, with the test cable 149 preferably including multiple test connectors in a daisy chain for supply circuits 118, one standard male connector for a utility outlet, and one standard female connector for the connection of extra test cables 149. In the exemplary embodiment, the supply circuits 118 can be mounted on the cathode side heatsink of the switching device 112, and can also be mechanically mounted to the GCT as an integral assembly. Moreover, the supply circuit 118 can be electrically integrated to the GCT gate board (driver 114).

The above examples are merely illustrative of several possible embodiments of various aspects of the present disclosure, wherein equivalent alterations and/or modifications will occur to others skilled in the art upon reading and understanding this specification and the annexed drawings. In particular regard to the various functions performed by the above described components (assemblies, devices, systems, circuits, and the like), the terms (including a reference to a "means") used to describe such components are intended to correspond, unless otherwise indicated, to any component, such as hardware, software, or combinations thereof, which performs the specified function of the described component (i.e., that is functionally equivalent), even though not structurally equivalent to the disclosed structure which performs the function in the illustrated implementations of the disclosure. In addition, although a particular feature of the disclosure may have been illustrated and/or described with respect to only one of several implementations, such feature maybe combined with one or more other features of the other implementations as may be desired and advantageous for any given or particular application. Also, to the extent that the terms "including", "includes", "having", "has", "with", or variants thereof are used in the detailed description and/or in the claims, such terms are intended to be inclusive in a manner similar to the term "comprising".

The following is claimed:

1. A switch circuit for selectively controlling conduction of current between first and second circuit nodes of a power converter, the switch circuit comprising:

a switching device having first and second switch terminals coupled with the first and second circuit nodes, respectively, or multiple switching devices in a series-connection having the first and last terminals coupled with the first and second circuit nodes respectively, and a control terminal for each switching device receiving a switching signal to selectively operate the switching device in one of a conductive state and a nonconductive state for controlling the conduction of current between first and second circuit nodes;

a switch driver having an output terminal coupled with the control terminal of the switching device and at least one power terminal for receiving power, the switch driver being operative to provide the switching signal according to a received switch control signal using power from the at least one power terminal;

a snubber circuit having a snubber storage device and first and second snubber terminals coupled with anode and cathode nodes of the switching device or switching devices;

a supply circuit forming a series circuit with the snubber circuit between the cathode and anode nodes in parallel with the switching device or devices, the supply circuit comprising:

a first converter circuit with a full bridge rectifier coupled to the snubber circuit, a supply storage device coupled with a first DC bus created by the rectifier, and a shunt coupled with the full bridge rectifier to sense a snubber current, and a second converter circuit with an isolated DC to DC converter receiving the first DC bus and providing an isolated main DC output to provide electrical power to the switch driver for operation of the switch driver; and a diagnostic circuit operatively coupled with the first converter circuit to monitor the first DC bus and with the second converter circuit to monitor the main DC output, wherein the diagnostic circuit is operatively coupled with the shunt to monitor the snubber current.

2. The switch circuit of claim 1, wherein the first converter circuit comprises:
  a first converter switching device coupled with the full bridge rectifier;
  a diode coupled between the first converter switching device and the supply storage device; and
  a first converter control circuit operative to control the switching device to regulate the first DC bus.

3. The switch circuit of claim 1, wherein the isolated DC to DC converter of the second converter circuit provides an auxiliary DC output, and wherein the first converter control circuit is powered by the auxiliary DC output.

4. The switch circuit of claim 1, wherein the isolated DC to DC converter of the second converter circuit provides an auxiliary DC output, and wherein the diagnostic circuit is powered by the auxiliary DC output.

5. The switch circuit of claim 1, wherein the diagnostic circuit comprises an optical output providing a coded visual indication of at least one fault condition detected by the diagnostic circuit.

6. The switch circuit of claim 1, wherein the diagnostic circuit comprises a diagnostic control output providing a signal indicative of at least one fault condition detected by the diagnostic circuit.

7. The switch circuit of claim 1, wherein the switch driver and the switching device are integrated.

8. The switch circuit of claim 1, wherein the switching device is a gate commutated thyristor (GCT) or symmetric gate commutated thyristor (SGCT) with a gate control terminal receiving the switching signal from the switch driver, and wherein the switch driver and the switching device form an integrated gate commutated thyristor (IGCT).

9. A power conversion system, comprising:
  an input for receiving input electrical power;
  an output for providing output electrical power;
  a switching system comprising a plurality of switch circuits coupled with the input and the output to selectively provide power from the input to the output according to a plurality of switch control signals, the individual switch circuits comprising:
    a switching device having first and second switch terminals coupled with the first and second circuit nodes, respectively, or multiple switching devices connected in series with the first and last terminals coupled with the first and second circuit nodes respectively, and a control terminal receiving a switching signal to selectively operate the switching device in one of a conductive state and a nonconductive state for controlling the conduction of current between first and second circuit nodes;
    a switch driver having an output terminal coupled with the control terminal of the switching device and at least one power terminal for receiving power, the switch driver being operative to provide the switching signal according to a received switch control signal using power from the at least one power terminal;
    a snubber circuit having a snubber storage device and first and second snubber terminals with one of the snubber terminals being coupled with an anode node of the switching device;
    a supply circuit forming a series circuit with the snubber circuit in parallel with the switching device, the supply circuit comprising:
      a first converter circuit with a full bridge rectifier coupled to the snubber circuit, a supply storage device coupled with a first DC bus created by the rectifier, and a shunt coupled with the full bridge rectifier to sense a snubber current, and
      a second converter circuit with an isolated DC to DC converter receiving the first DC bus and providing an isolated main DC output to provide electrical power to the switch driver for operation of the switch driver; and
    a diagnostic circuit operatively coupled with the first converter circuit to monitor the first DC bus and with the second converter circuit to monitor the main DC output, wherein the diagnostic circuit is operatively coupled with shunt to monitor the snubber current.

10. The power conversion system of claim 9, wherein the power conversion system is a current source rectifier receiving AC input power and providing DC output power.

11. The power conversion system of claim 9, wherein the individual first converter circuits comprise:
  a first converter switching device coupled with the full bridge rectifier;
  a diode coupled between the first converter switching device and the supply storage device; and
  a first converter control circuit operative to control the switching device to regulate the first DC bus.

12. The power conversion system of claim 9, wherein the isolated DC to DC converter of the second converter circuit provides an auxiliary DC output, and wherein the diagnostic circuit is powered by the auxiliary DC output.

13. The power conversion system of claim 9, wherein the diagnostic circuit comprises an optical output providing a coded visual indication of at least one fault condition detected by the diagnostic circuit.

14. The power conversion system of claim 9, wherein the diagnostic circuit comprises a diagnostic control output providing a signal indicative of at least one fault condition detected by the diagnostic circuit.

15. The power conversion system of claim 9, wherein the supply storage device receives charging current from the snubber circuit when a voltage across the first and second switch terminals of the switching device is positive and also receives charging current from the snubber circuit when the voltage across the first and second switch terminals of the switching device is negative.

16. The power conversion system of claim 9, wherein the supply circuit set in a test mode automatically by attaching a test cable to test terminals of the switching system, wherein the snubber network and the cathode heatsink are disconnected from the power conversion system when the test cable is connected and utility power is supplied to the power conversion system via the test cable.

17. The power conversion system of claim 9, wherein the supply circuit operates at or close to cathode potential of the switching device.

* * * * *